(12) United States Patent
Yoo et al.

(10) Patent No.: US 12,002,754 B2
(45) Date of Patent: Jun. 4, 2024

(54) MULTI-HEIGHT AND MULTI-WIDTH INTERCONNECT LINE METALLIZATION FOR INTEGRATED CIRCUIT STRUCTURES

(71) Applicant: Intel Corporation, Santa Clara, CA (US)

(72) Inventors: Hui Jae Yoo, Hillsboro, OR (US); Kevin L. Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 761 days.

(21) Appl. No.: 16/911,879

(22) Filed: Jun. 25, 2020

(65) Prior Publication Data

US 2021/0407907 A1 Dec. 30, 2021

(51) Int. Cl.
*H01L 23/528* (2006.01)
*H01L 21/311* (2006.01)
(Continued)

(52) U.S. Cl.
CPC .... *H01L 23/5283* (2013.01); *H01L 21/31116* (2013.01); *H01L 21/32* (2013.01);
(Continued)

(58) Field of Classification Search
CPC ............. H01L 23/5283; H01L 23/5226; H01L 23/5286; H01L 23/5322; H01L 23/5386;
(Continued)

(56) References Cited

U.S. PATENT DOCUMENTS

2005/0280152 A1* 12/2005 Fitzsimmons .... H01L 21/76805
257/E21.585
2006/0180930 A1* 8/2006 Nguyen .............. H01L 23/5226
257/E23.152
(Continued)

FOREIGN PATENT DOCUMENTS

TW 201729312 8/2017

OTHER PUBLICATIONS

Office Action from Taiwanese Patent Application No. 109145487 notified Mar. 15, 2024, 9 pgs.

*Primary Examiner* — Shahed Ahmed
*Assistant Examiner* — Vicki B. Booker
(74) *Attorney, Agent, or Firm* — Essential Patents Group, LLP

(57) ABSTRACT

Integrated circuit metallization lines having a planar top surface but different vertical heights, for example to control intra-layer resistance/capacitance of integrated circuit interconnect. A hardmask material layer may be inserted between two thicknesses of dielectric material that are over a via metallization. Following deposition of the hardmask material layer, trench openings may be patterned through the hardmask layer to define where line metallization will have a greater height. Following the deposition of a thickness of dielectric material over the hardmask material layer, a trench pattern may be etched through the uppermost thickness of dielectric material, exposing the hardmask material layer wherever the trench does not coincide with an opening in the hardmask material layer. The trench etch may be retarded (Continued)

where the hardmask material layer is exposed, resulting to trenches of differing depth. Trenches of differing depth may be filled with metallization and then planarized.

10 Claims, 8 Drawing Sheets

(51) Int. Cl.
    *H01L 21/32* (2006.01)
    *H01L 21/768* (2006.01)
    *H01L 23/522* (2006.01)
    *H01L 23/532* (2006.01)

(52) U.S. Cl.
    CPC .... *H01L 21/76816* (2013.01); *H01L 21/7684* (2013.01); *H01L 21/76877* (2013.01); *H01L 23/5226* (2013.01); *H01L 23/5286* (2013.01); *H01L 23/53228* (2013.01)

(58) Field of Classification Search
    CPC ............... H01L 21/31116; H01L 21/32; H01L 21/7681; H01L 21/7684; H01L 21/7687; H01L 21/76804; H01L 21/76831; H01L 21/76879
    See application file for complete search history.

(56) References Cited

U.S. PATENT DOCUMENTS

| | | | |
|---|---|---|---|
| 2012/0175733 A1* | 7/2012 | Kastenmeier | H01L 23/5223 257/532 |
| 2020/0135845 A1 | 5/2020 | Seidel et al. | |

* cited by examiner

MULTI-HEIGHT AND MULTI-WIDTH INTERCONNECT LINE METALLIZATION FOR INTEGRATED CIRCUIT STRUCTURES

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay associated with interconnects of an IC increase with the density of the interconnects.

Resistance of interconnect metallization lines can be reduced if the cross-sectional area is increased. Increasing the line height of only a subset of lines would be advantageous for tuning or otherwise controlling R&C within a given interconnect level of an IC. Although multiple height interconnects can enable intra-layer R&C optimization, process complexity may be disproportionately increased, which would result in additional cost and performance loss, for example due to edge placement errors.

Fabrication techniques and interconnect structures including metallization lines of differing heights within a single interconnect level that have minimal complexity would therefore be commercially advantageous over alternative techniques and structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
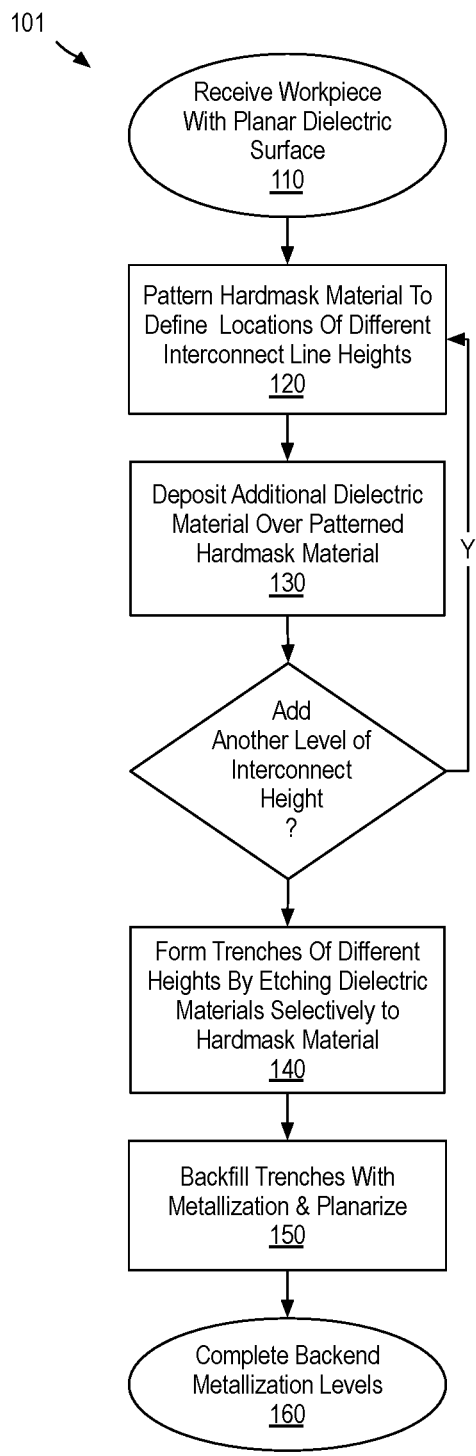
FIG. 1 is a flow chart of methods of fabricating metallization lines of different heights and widths, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or may have one or more intervening materials or layers. Moreover, one material disposed between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described below are examples of integrated circuit interconnect structures in which metallization lines having a planar top surface have different vertical heights. Such metallization lines may be included within one level of interconnect metallization, for example as a means of controlling intra-layer resistance and/or capacitance of integrated circuit interconnects. During fabrication of an IC, one or more hardmask material layer may be inserted between thicknesses of a dielectric material. The intervening hardmask material layer may be patterned after it is deposited and prior to being covered within an overlying thickness of dielectric material. Overlap between openings in the hardmask material layer and an overlying trench mask pattern may determine where a trench will have greater depth with shallower trench depths being located where the hardmask material is retained. After forming trenches of differing depths, a metallization process, such as an electrolytic plating process, may fill the trenches with the resulting metallized features having heights dependent upon the trench depth. A planarization process may then define a co-planar top surface for all line metallization of an interconnect level.

FIG. 1 is a flow chart of methods 101 for fabricating metallization lines of different heights and widths, in accordance with some embodiments. FIG. 2A-5A illustrate a plan view of a portion of an interconnect structure 201 evolving as methods 101 are practiced, in accordance with some embodiments. FIG. 2B-5B illustrate a first cross-sectional view of interconnect structure 201 along the B-B' line depicted in FIG. 2A-5A, respectively.

Referring first to FIG. 1, methods 101 begin at input 110 where a workpiece having a planar dielectric surface, is received. In some embodiments, the workpiece includes a semiconductor wafer, such as a large format (e.g., 300-450 mm) wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more underlying device layers including the semiconductor material layer, and may also have one or more interconnect levels interconnecting the devices (e.g. transistors). As received, the work surface of the workpiece is advantageously planar and comprises a thickness of dielectric material over any number of underlying device or interconnect levels. At block 120, a hardmask material layer is deposited over the workpiece work surface, and patterned (e.g., with an anisotropic masked etch process) to define locations where an interconnect line will have different heights.

Figure 2A:
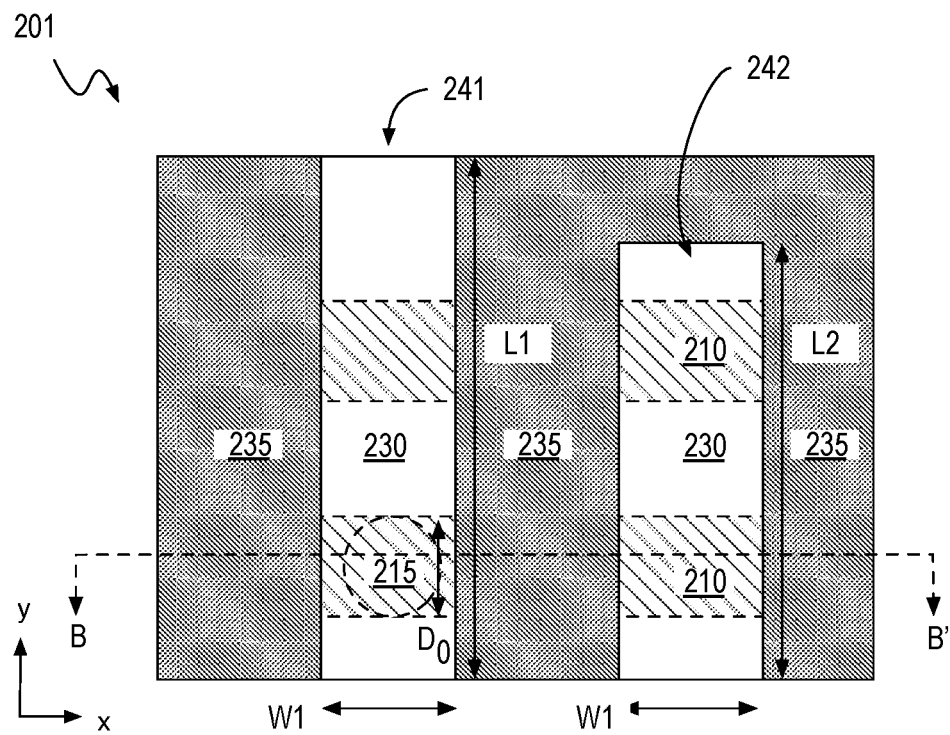
FIGS. 2A, 3A, 4A, and 5A illustrate a plan view of a portion of an interconnect structure evolving as the methods illustrated in FIG. 1 are practiced, in accordance with some embodiments.

In the example shown in FIG. 2A, a hardmask material layer 235 is illustrated as having been etched to only partially cover an underlying dielectric material 230. Retained hardmask material layer 235 defines openings 241, 242 exposing an underlying dielectric material 230. Opening 241 is a trench having a longitudinal length L1 and a transverse width W1. In exemplary embodiments, longitudinal length L1 is significantly (e.g., 3×) larger than transverse width W1. Opening 242 is likewise a trench, substantially parallel to opening 241, but with a shorter longitudinal length L2 to further illustrate a trench end. Below dielectric material 230 there is a lower interconnect level including line metallization 210 and a via metallization 215, which are drawn in dashed line as being below the surface. Via metallization 215 has a maximum lateral diameter D0, which may vary with implementation, but is generally significantly smaller than the length of line metallization (e.g., diameter D0 is significantly smaller than longitudinal lengths L1 and L2).

Figure 2B:
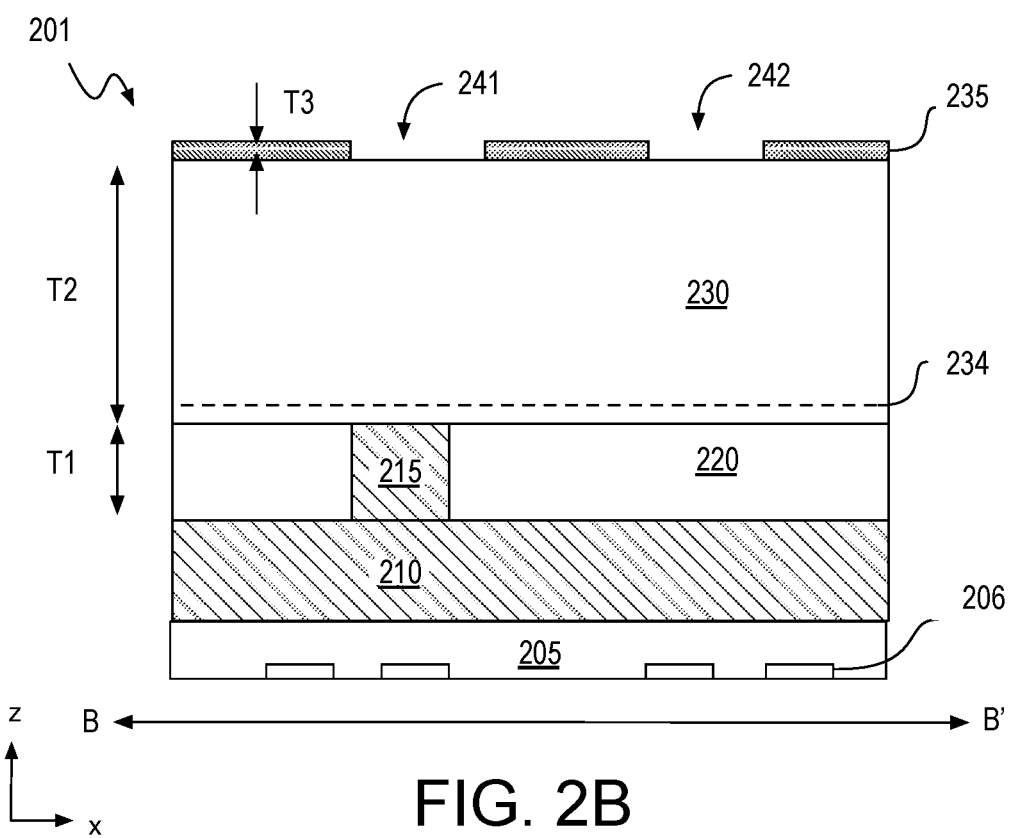
FIGS. 2B, 3B, 4B and 5B illustrate a first cross-sectional view of a portion of an interconnect structure evolving as the methods illustrated in FIG. 1 are practiced, in accordance with some embodiments.

As further shown in FIG. 2B, interconnect structure 201 is over a portion of an underlying substrate that includes a device layer 205. Within device layer 205 are a plurality of devices 206. In exemplary embodiments, devices 206 are metal-oxide-semiconductor field effect transistor (MOSFET) structures, however devices 206 may also be other transistor types, such as, but not limited to other FET architectures, bipolar junction transistors, or may be other devices including one or more semiconductor junctions (e.g., diodes, etc.). Via metallization 215 has a height substantially equal to a thickness T1 of a dielectric material 220. Thickness T1 may vary with implementation, but in some exemplary embodiments is 5 nm-50 nm. Dielectric material 220 is substantially coplanar with a top of via metallization 215. Dialectric material 230 has a thickness T2 over the top of via metallization 215, and over dielectric material 220. Thickness T2 may vary with implementation, but in some exemplary embodiments is 10-50 nm, or more. Dielectric materials 220 and 230 may be any dielectric material suitable for electrical isolation of integrated circuitry. Dielectric materials 220 and 230, may for example, have substantially the same composition, and may both be a low-k dielectric material (e.g., SiOC) having a relative permittivity below 3.5. In other examples, dielectric materials 220 and 230 may be any of SiO, SiON, hydrogen silsesquioxane, methyl silsesquioxane, polyimide, polynorbornenes, benzocyclobutene, or the like. Dielectric materials 220 and 230 may be deposited as a flowable oxide, for example, and have substantially planar top surfaces.

Hardmask material layer 235 has a thickness T3, which may also vary with implementation. In some exemplary thickness T3 is less than 10 nm, and advantageously no more than 5 nm (e.g., 2-3 nm, etc.). Hardmask material layer 235 is also a dielectric material, but advantageously has a different composition than dielectric material 230. Hardmask material layer 235 may have a somewhat higher relative permittivity than dielectric material 230. Hardmask material layer 235 may be a composition such as, but not limited to, SiN, SiO, SiON, HfO2, ZrO, Al2O3, for example.

In accordance with some further embodiments, an intervening trench stop material layer 234 may be between dielectric materials 220 and 230. Trench stop material layer 234 is illustrated in dashed line to emphasize such a trench stop material layer may be absent. As shown, trench stop material layer 234 is in contact with the top surface of via metallization 215. Trench stop material layer 234 is also a dielectric material, but advantageously has a different composition than dielectric material 230. Trench stop material layer 234 may have a high-k composition, such as, but not limited to, SiN, SiO, SiON, HfO2, ZrO, Al2O3, for example. Trench stop material layer 234 may have any thickness, but in some advantageous embodiments has a thickness less than 10 nm, and advantageously no more than 5 nm (e.g., 2-3 nm, etc.).

Returning to FIG. 1, methods 101 continue at block 130 where an additional thickness of dielectric material is deposited over the hardmask material, filling any openings that were patterned into the hardmask material. Methods 101 may optionally proceed to iterate blocks 120 and 130 to build up any number of patterned hardmask material layers between unpatterned dielectric materials with each of the hardmask material layers ultimately to define another height level for line metallization. Methods 101 then continue at block 140 where trenches of different heights are formed by etching the dielectric material deposited at block 130 selectively relative to the hardmask dielectric material (i.e., hardmask dielectric material etches less rapidly). At block 140, a mask material (e.g., a photosensitive material) may first be patterned with trench openings, and the mask pattern is then translated by an anisotropic etch of the underlying dielectric materials. The dielectric material etch may proceed unimpeded where mask trench openings coincide with openings previously formed in the hardmask material layer(s). However, the dielectric material etch is retarded where mask trench openings coincide with an unpatterned region of the hardmask material layer(s). The etch at block 140 will therefore reach different depths according to a summation of the overlying trench mask pattern and the underlying hardmask material layer pattern(s).

Figure 3A:
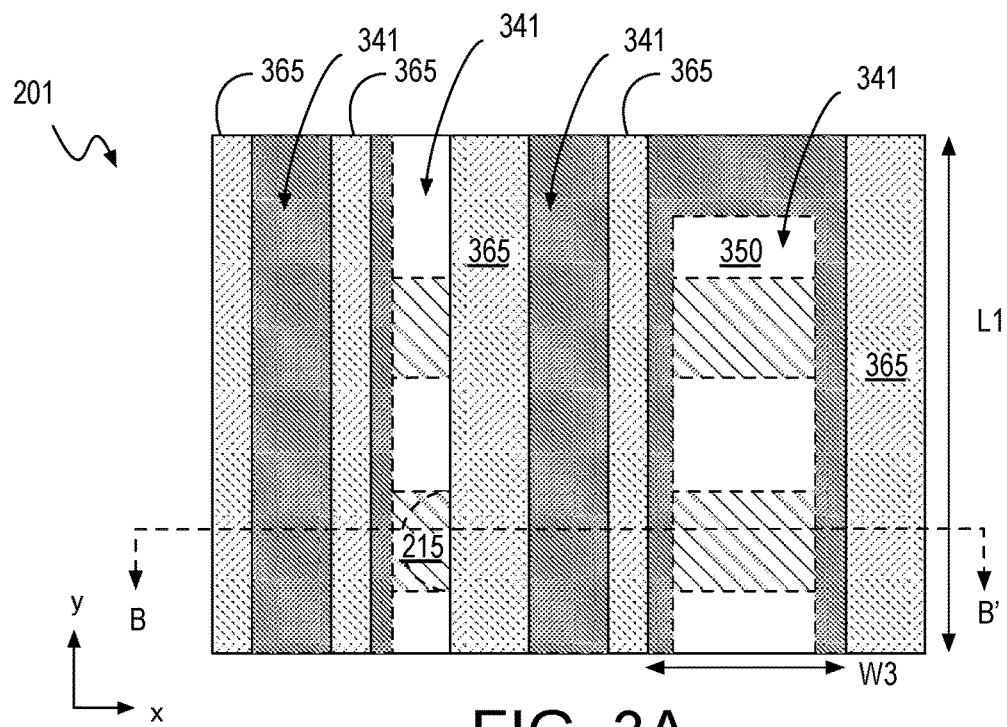
Figure 3B:
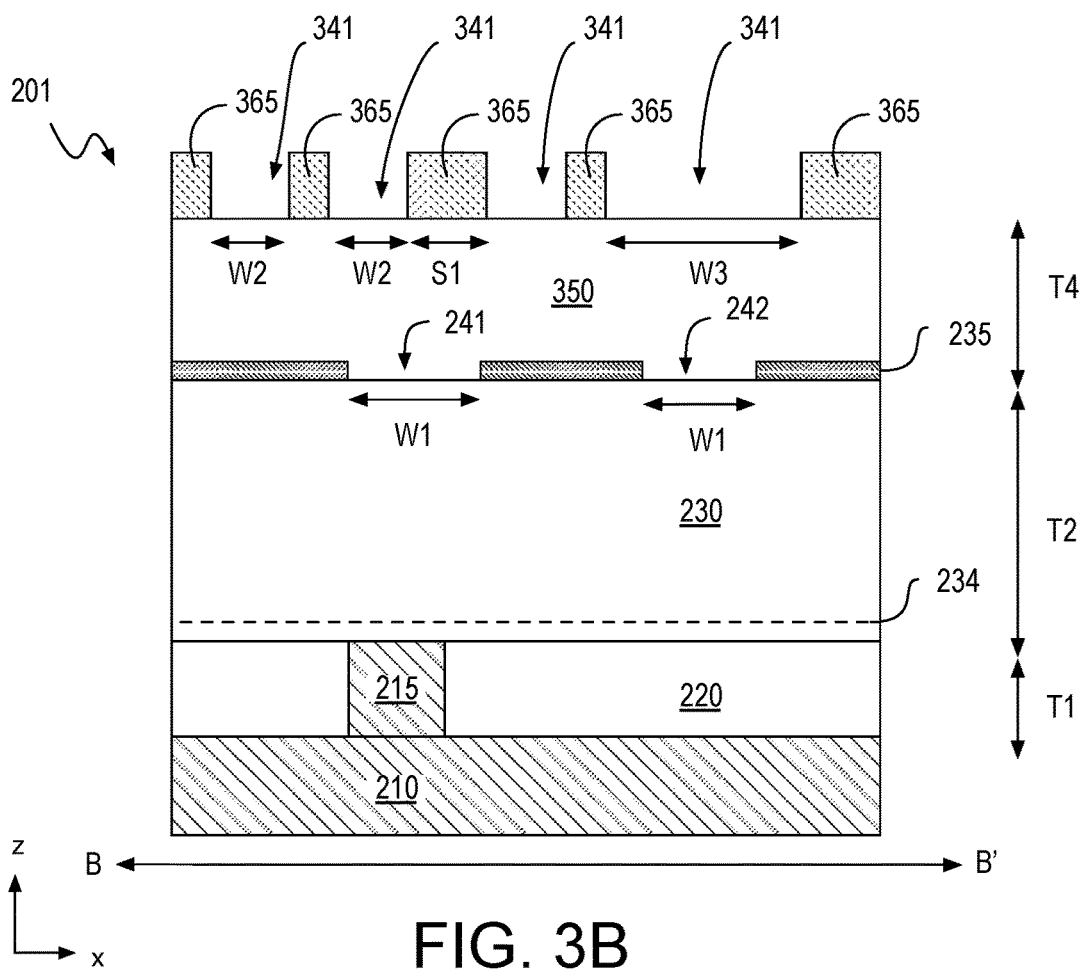

In the example further illustrated in FIG. 3A (plan view) and FIG. 3B (cross-sectional view), a trench mask material 365 has been formed over a dielectric material 350. Dialectic material 350 has been deposited to a thickness T4 over the top of dielectric material 230, for example with any dielectric deposition process known to be suitable for the composition. Thickness T4 may vary with implementation, but in some exemplary embodiments is 10-50 nm. Dielectric material 350 may again be any dielectric material suitable for electrical isolation of integrated circuitry such as, but not limited to, SiN, SiO, SiON, SiOC, hydrogen silsesquioxane, methyl silsesquioxane, polyimide, polynorbornenes, benzocyclobutene, or the like. In some exemplary embodiments, dielectric material 350 has substantially the same composition as dielectric material 230.

Trench mask material 365 has been patterned with trench openings 341 having longitudinal length L1. Although not illustrated, openings 341 have ends somewhere beyond the perimeter of interconnect structure 201. Trench openings 341 have various transverse widths W2, W3 that are smaller than length L1. Trench openings 341 are separated by space S1. Trench mask material 365 may be a photosensitive sacrificial layer (i.e., photoresist mask), or may be a sacrificial hardmask material layer that was previously etched according to a photoresist mask. In still other embodiments, trench mask material 365 is a non-sacrificial material layer, for example, representing another iteration of hardmask material layer 235. As shown in FIG. 3B, a trench opening 341 of width W2 is entirely over a portion of hardmask material layer 235. Another trench opening 341 of width W2 is partially overlapping hardmask material layer 235 and a portion of hardmask opening 241. Another trench opening 341 of width W3 is completely over hardmask opening 242.

Figure 4A:
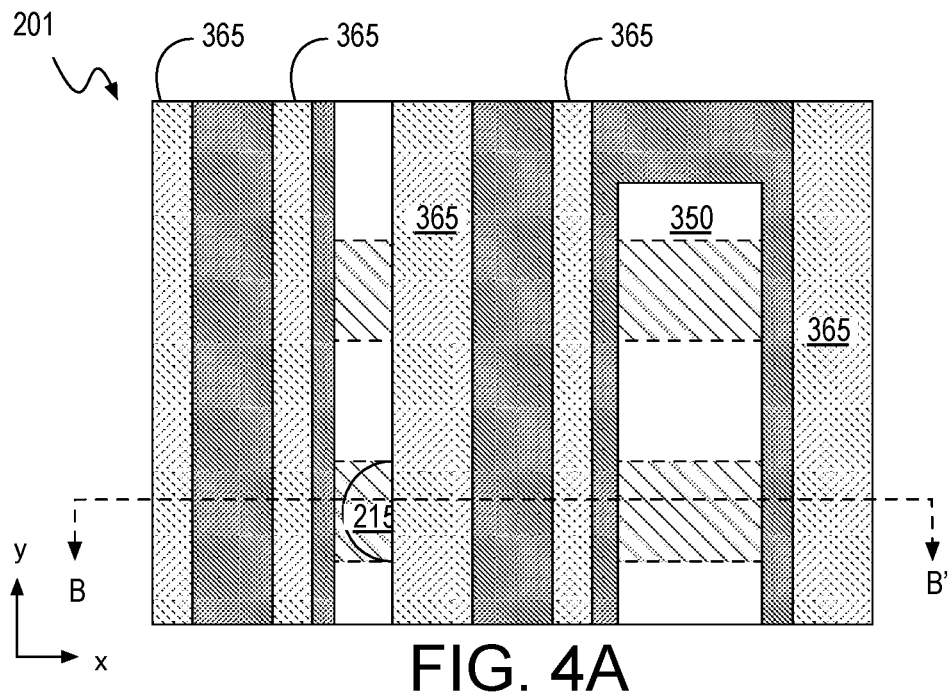
Figure 4B:
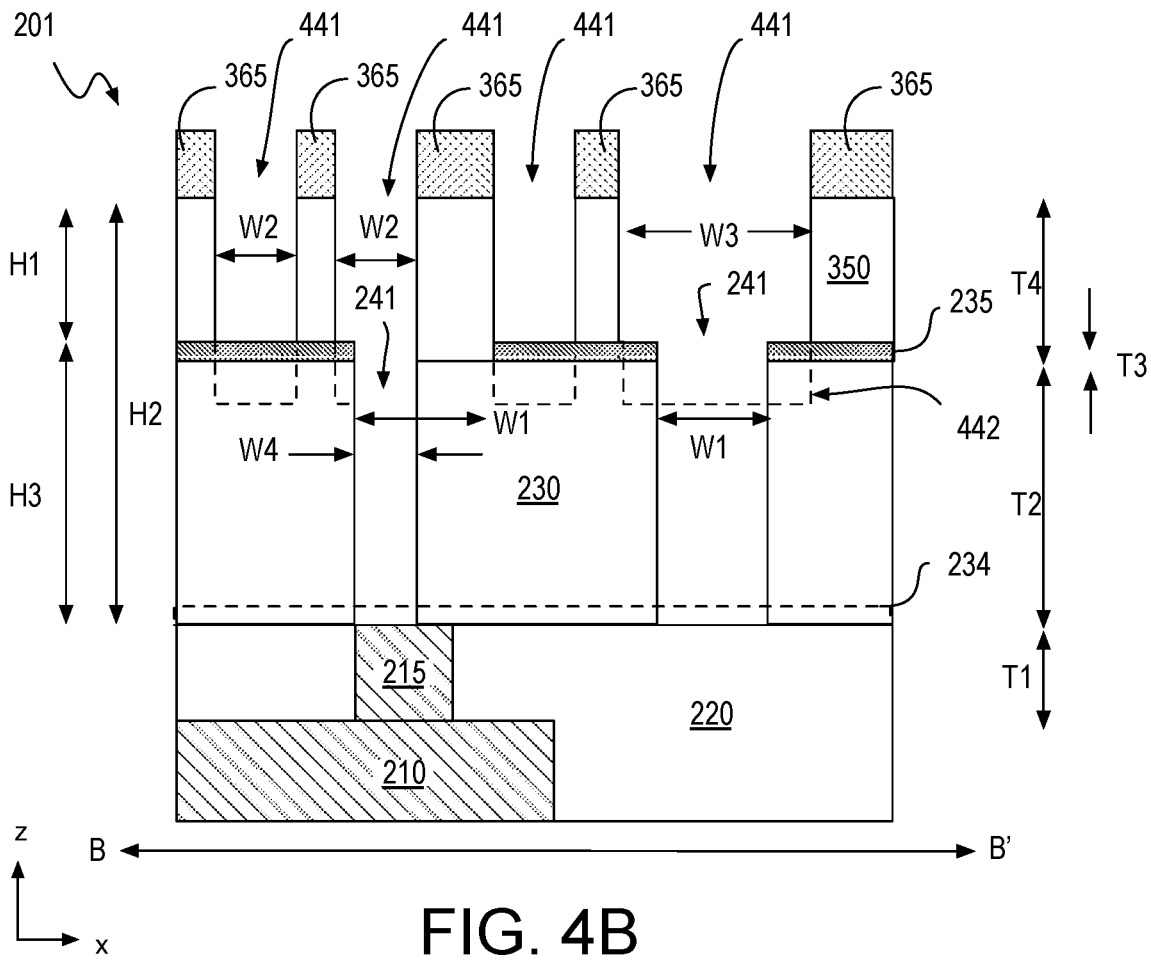

In the example further illustrated in FIG. 4A-4B, trenches 441 of differing heights (depths), have been anisotropically etched into dielectric material 350. Any single-step or multistep anisotropic reactive ion etch (RIE) process (e.g., based on a CxFy plasma chemistry) may be practiced to form trenches 441 as embodiments are not limited in this respect.

Although trenches 441 are depicted with ideal profiles having substantially vertical (e.g., z-dimension) sidewalls, it is appreciated that trenches 441 may instead have less idealized profiles, for example with tapered sidewall slopes and a top width being slightly larger than a bottom width. As shown, a subset of trenches 441 have a minimum height H1 where they intersect hardmask material layer 235, and another subset of trenches 441 have a maximum height H2 where they intersect an opening in hardmask material layer 235.

Minimum trench height H1 is at least equal to the dielectric material thickness T4. Depending on selectively of the etch process, some or all of hardmask material layer thickness T3, and even a portion of dielectric material thickness T2 may be removed during the trench etch. Hence, hardmask material layer 235 may be at the bottom of trench 441, or a trench bottom 442 may be somewhere within dielectric material 230, as illustrated by dashed line. Trench height H2 is greater than trench height H1 and will be at least equal to dielectric material thickness T4 summed with hardmask material layer thickness T3. Only at the maximum trench height H2, will trenches 441 be at a sufficient depth to expose an under lying via, if in proper alignment. In the illustrated example, trench height H2 is substantially equal to a sum of dielectric material thicknesses T2 and T4 further summed with hardmask material thickness T3. For embodiments that further include trench stop material layer 234, trench height H2 may be controlled to terminate on trench stop material layer 234. For such embodiments, trench height H2 is a sum of thicknesses T2, T3 and T4 further summed with the thickness of trench stop material layer 234, which may be removed (e.g., with a short timed etched) to expose via metallization 215.

Along with different heights H1 and H2, trenches 441 also have different discrete widths between heights H1 and H3 (which equals height H2 less height H1). The differing widths are a function of both overlay and dimensions of openings in trench mask material 365 and hardmask material layer 235. For the illustrated trench profiles, transverse widths are constant, for tapered profiles at least some portion of trenches 441 have the transverse widths illustrated. As shown in FIG. 4B, a trench 441 has an upper portion of height H1 that has a transverse width W2, while a lower portion of height H3 has a transverse width W4 that is smaller than width W2 as a result of there being only a partial overlap between trench 441 and hardmask opening 241 of width W1. Another trench 441 has an upper portion of height H1 that has a transverse width W3, while a lower portion of height H3 has a transverse width W1 that is smaller than width W3 as a result of trench 441 being reduced by width W1 associated with hardmask opening 241.

Returning to FIG. 1, methods 101 continue at block 150 where trenches of various depths are at least partially backfilled to form line metallizations of differing heights. The backfilling may proceed according to one or more deposition techniques, such as, but not limited to electrolytic plating. The metallization deposited may have any composition known to be suitable for IC interconnect structures. Following metal deposition, a top surface of the line metallization may be planarized, for example with any CMP process so that all lines of metallization have a coplanar top surface, regardless of their heights, which remain a function of their respective trench depths.

Figure 5A:
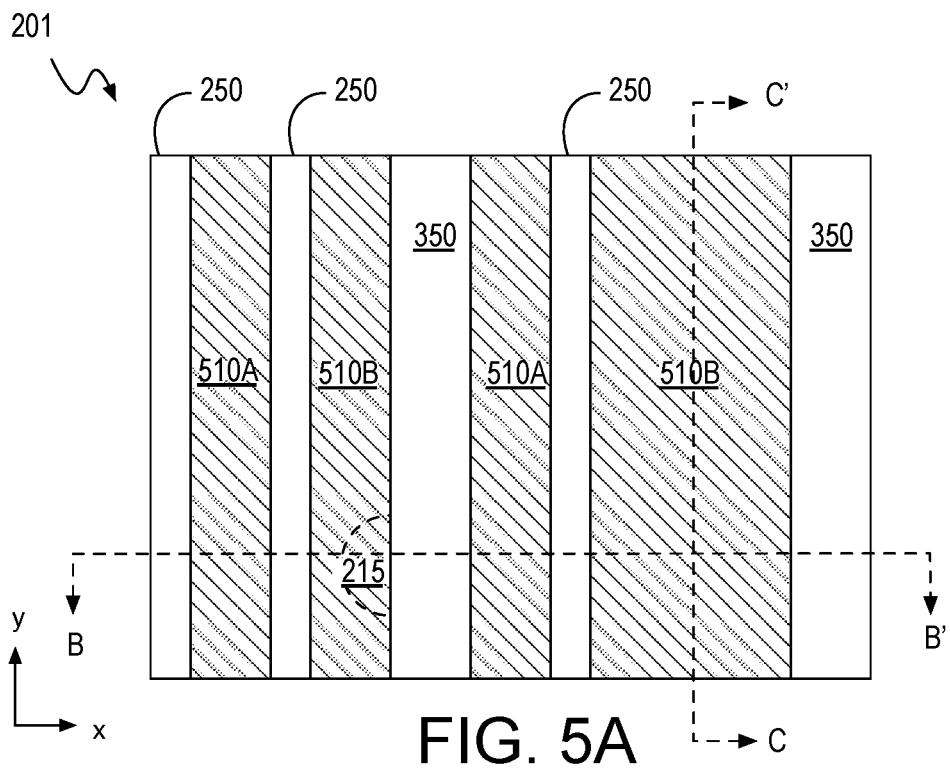
Figure 5B:
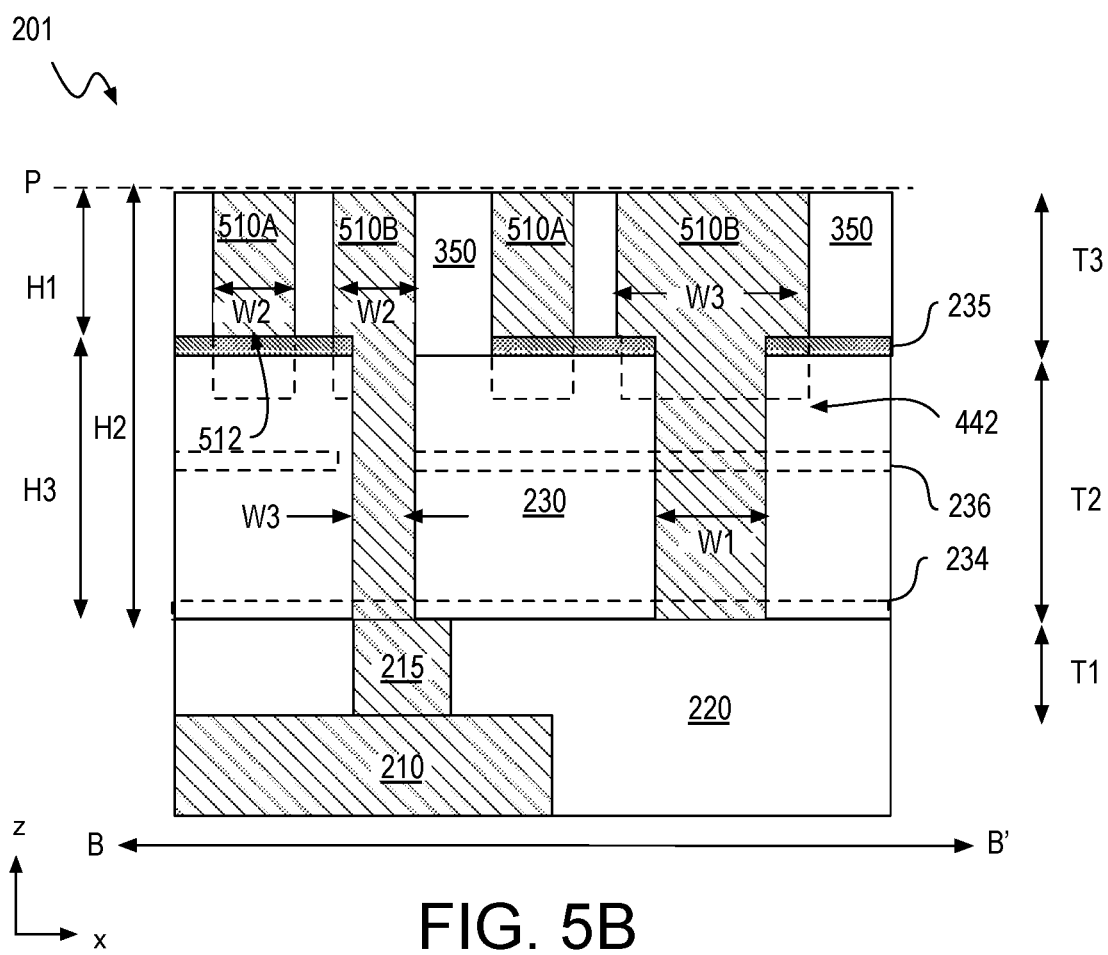

In the example further illustrated in FIGS. 5A and 5B, interconnect structure 201 includes a shallow line metallization 510A and a deep line metallization 510B. Line metallizations 510A and 510B may have substantially the same metallization composition and/or structure. For example, in some embodiments line metallizations 510A and 510B include at least copper, deposited, for example with an electrolytic plating process. In some further embodiments, line metallizations 510A and 510B include one or more of an adhesion layer and/or barrier layer (not depicted). For example, a TaN layer may be first deposited (e.g., substantially conformally) as a diffusion barrier/liner layer, followed by a fill metal comprising predominantly copper that is deposited over the TaN layer.

As shown in FIGS. 5A and 5B, line metallization 510A is of height H1 and has a top surface that is substantially co-planar along plane P with line metallization 510B that is of height H2. Plane P is substantially orthogonal to heights H1 and H2, for example being parallel with a plane of the substrate (not depicted). In the illustrated example, line metallization 510A has a bottom surface 512 in direct contact with hardmask material layer 235. However, in other embodiments where height H1 extends through hardmask material layer 235 and into dielectric material 230, bottom surface 512 may be at the trench bottom 442 illustrated in dashed line.

Along with a greater height H2, line metallization 510B have different discrete widths over heights H1 and H3 as a function of trench geometries. As shown in FIG. 5B, line metallization 510B has an upper line portion of height H1 that has a transverse width W2, while a lower line portion of height H3 has a transverse width W4 that is smaller than width W2 as a result of there being only a partial overlap between trench 441 and hardmask opening 241 of width W1. Another trench 441 has an upper portion of height H1 that has a transverse width W3, while a lower portion of height H3 has a transverse width W1 that is smaller than width W3 as a result of trench 441 being reduced by width W1 associated with hardmask opening 241. This "T-shape" line metallization profile may be particularly advantageous for increasing conductivity of a metallization line while minimizing the aspect ratio of trench 441.

The amount of capacitance between two adjacent lines 510A and 510B may be limited by the minimum height H1 of a subset of the lines (e.g., 510A), while the minimum resistance of two adjacent lines 510A, 510B may be a function the maximum height H2 of a subset of the lines (e.g., 510B). Hence, within one metallization level, an interconnect structure may have metallization lines of minimum resistance interspersed with lines of minimum capacitance. In other words, two lines of metallization having minimum resistance (e.g., lines 510B) may be separated by one or more lines of metallization having minimum capacitance (e.g., lines 510A) to space apart the lines of minimum resistance (e.g., lines 510B) without sacrificing line metallization density.

As further illustrated in FIG. 5B, dashed boxes 236 represent another patterned hardmask material layer substantially the same as hardmask material layer 235. Such an additional patterned hardmask material layer may be present, for example when methods 101 (FIG. 1) iterate blocks 120 and 130 twice. It should be clear that such a second hardmask material layer will further enable a third line metallization height (not depicted) in addition to the two line metallization heights H1 and H2 illustrated in FIG. 5B. Hence, although only two line metallization heights are illustrated in FIG. 5B, an interconnect structure may include three or more such levels of line metallization heights.

Figure 5C:
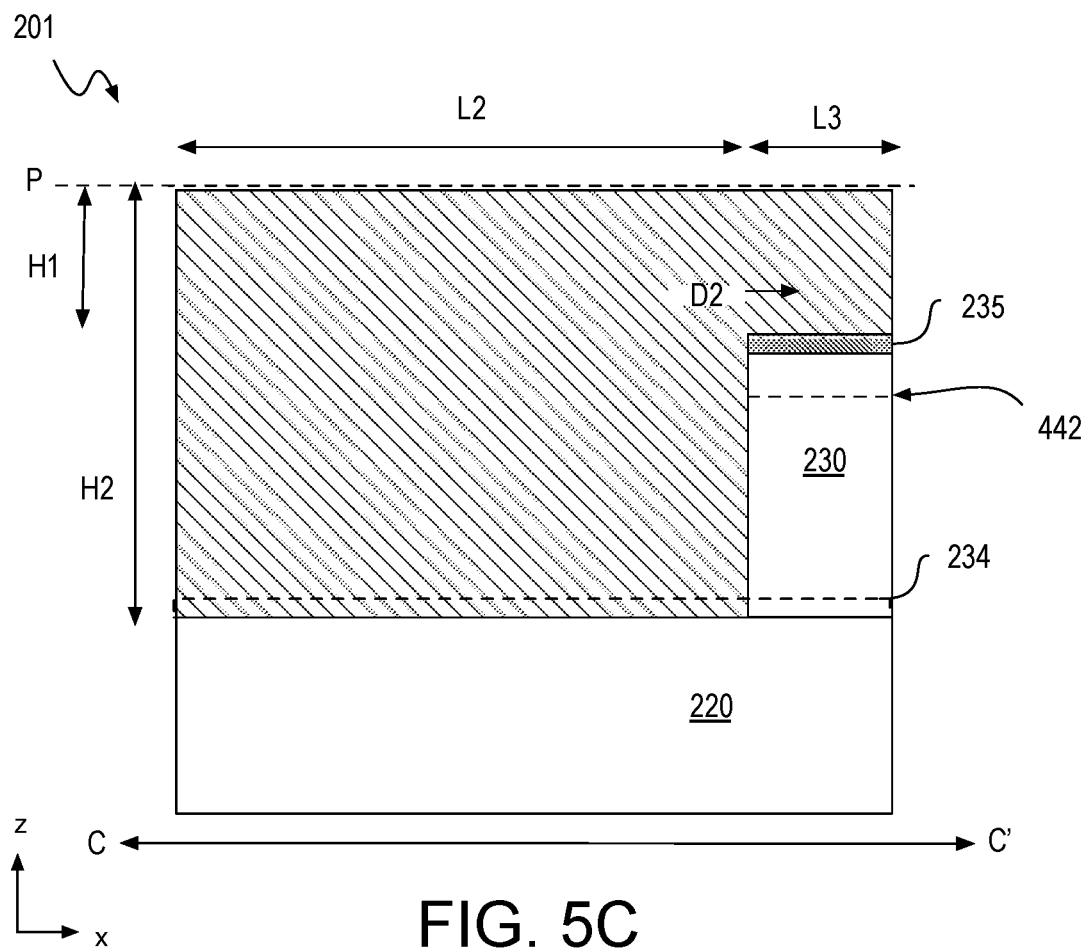
FIG. 5C illustrates a second cross-sectional view of a portion of an interconnect structure following the practice of the methods illustrated in FIG. 1, in accordance with some embodiments.

FIG. 5C further illustrates a second cross-sectional view along the C-C' line further denoted in FIG. 5A, which is taken along longitudinal length of line metallization 510B. As shown in FIG. 5C, line metallization 510B includes a first line segment of longitudinal length L2 that has line height H2, and a second line segment of longitudinal length L3 that has line height H. Hence, as a function of openings in hardmask material layer 235, the single line metallization 510B has both lower resistance segments and higher resistance segments. An interconnect structure in accordance with embodiments may therefore not only include separate lines of metallization having different heights, but the longitudinal length of a single line may be comprised of line segments having different height.

Returning to FIG. 1, methods 101 may then be completed at output 160 where any number of additional backend metallization levels may be fabricated according to any techniques to complete the integrated circuitry. Such backend metallization levels may further include one or more levels that also include multi-level metallization lines, for example substantially as described above. Alternatively, such backend metallization levels may only comprise damascene-type structures, semi-additive, or subtractively define interconnect metallization features as embodiments herein are not limited in this respect.

Figure 6:
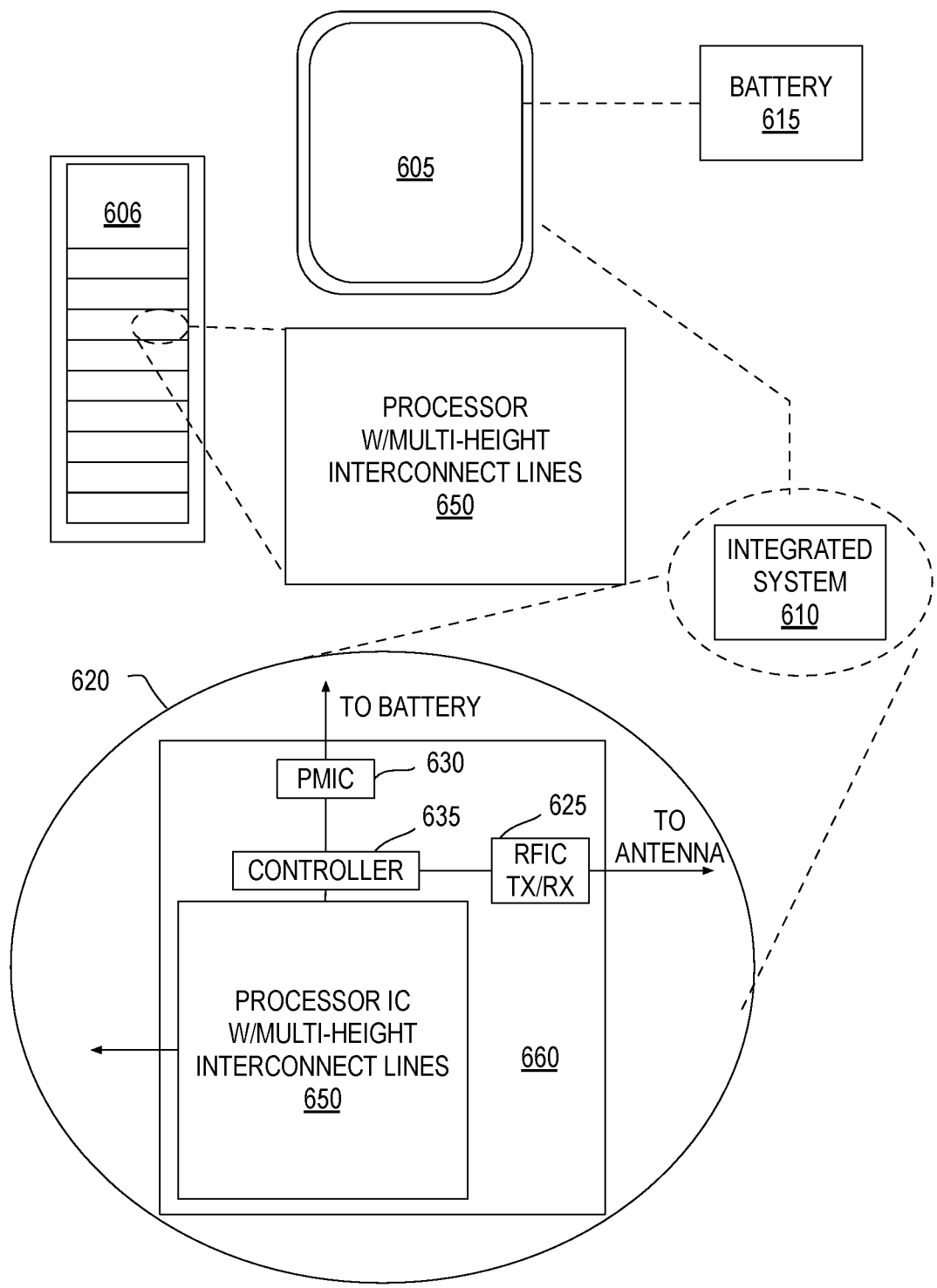
FIG. 6 illustrates a mobile computing platform and a data server machine employing an IC including an interconnect structure with metallization lines of differing heights, in accordance with some embodiments.

FIG. 6 illustrates a mobile computing platform 605 and a data server computing platform 606 employing an IC including interconnect structures with line metallizations of different heights within a single metallization level, for example as described elsewhere herein. The server platform 606 may be any commercial server, for example including any number of high-performance computing platforms disposed within a rack and networked together for electronic data processing, which in the exemplary embodiment includes a microprocessor 650 including interconnect structures with line metallizations of different heights within a single metallization level, for example as described elsewhere herein.

The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), a chip-level or package-level integrated system 610, and a battery 615. At least one IC of chip-level or package-level integrated system 610 includes an interconnect structure with line metallizations of different heights within a single metallization level, for example as described elsewhere herein. In the example shown in expanded view 620, integrated system 610 includes microprocessor 650 including interconnect structures with line metallizations of different heights within a single metallization level, for example as described elsewhere herein. Microprocessor 650 may be further coupled to a board 660, a substrate, or an interposer. One or more of a microcontroller 635, a power management integrated circuit (PMIC) 630, or an RF (wireless) integrated circuit (RFIC) 625 including a wideband RF (wireless) transmitter and/or receiver (TX/RX) may be further coupled to board 660.

Functionally, PMIC 630 may perform battery power regulation, DC-to-DC conversion, etc., and so has an input coupled to battery 615 and with an output providing a current supply to other functional modules (e.g., microprocessor 650). As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 7:
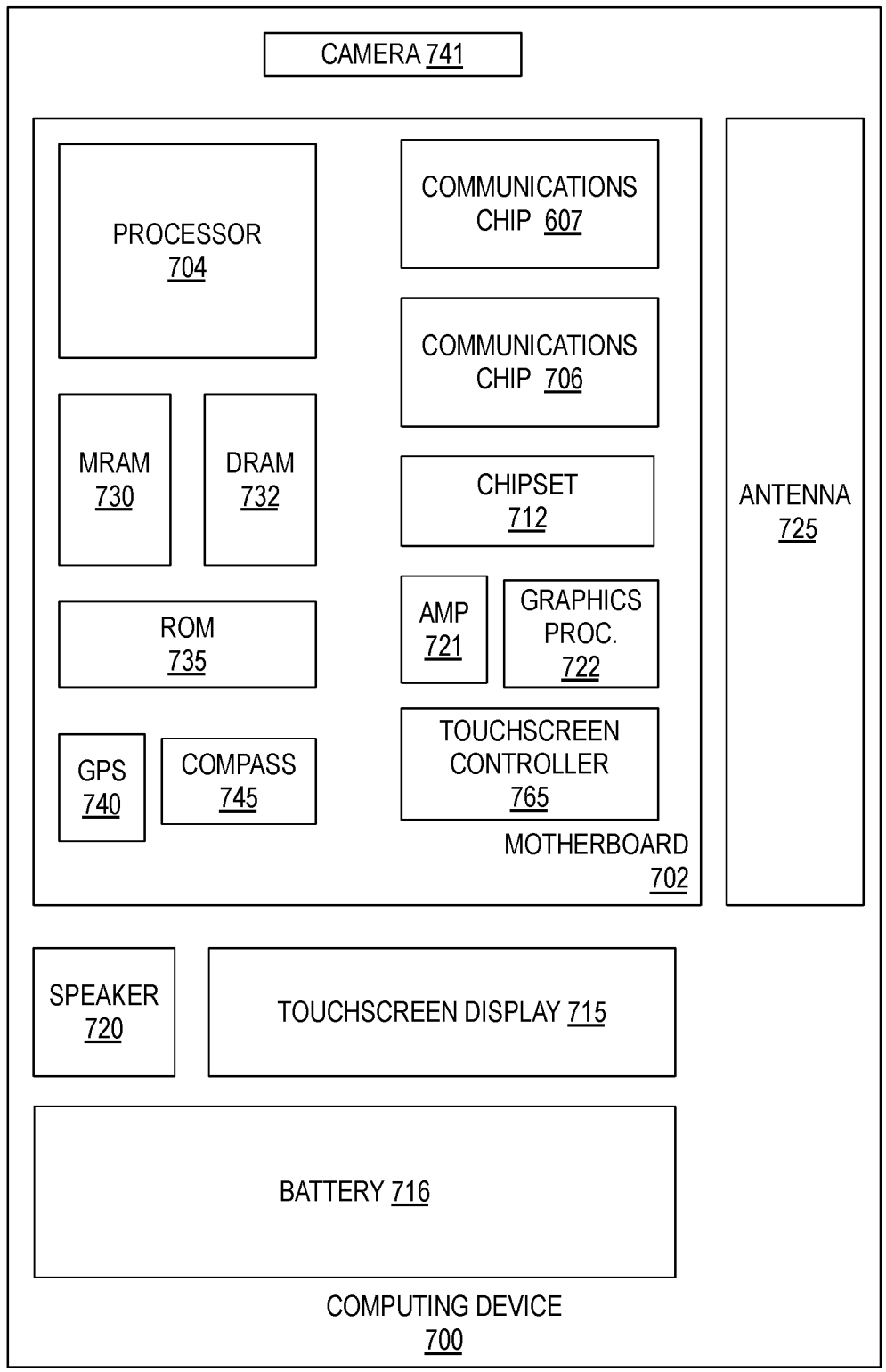
FIG. 7 is a functional block diagram of an electronic computing device, in accordance with some embodiments.

FIG. 7 is a functional block diagram of an electronic computing device 700, in accordance with an embodiment of the present invention. Computing device 700 may be found inside platform 605 or server platform 606, for example. Device 700 further includes a motherboard 702 hosting a number of components, such as, but not limited to, a processor 704 (e.g., an applications processor). Processor 704 may be physically and/or electrically coupled to motherboard 702. In some examples, processor 704 includes interconnect structures with line metallizations of different heights within a single metallization level, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the motherboard 702. In further implementations, communication chips 706 may be part of processor 704. Depending on its applications, computing device 700 may include other components that may or may not be physically and electrically coupled to motherboard 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like. In some exemplary embodiments, at least one of the functional blocks noted above include interconnect structures with line metallizations of different heights within a single metallization level, for example as described elsewhere herein.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) interconnect structure, comprises a via metallization within a first thickness of dielectric material, a second thickness of dielectric material over the first thickness of dielectric material, and a third thickness of dielectric material over the second thickness of dielectric material with a hardmask material layer therebetween. The IC interconnect structure further comprises a first line metallization within the third thickness of dielectric material, the first line metallization having a top surface and a first height, orthogonal to the top surface, that is at least equal to the third thickness of dielectric material. The IC interconnect structure further comprises a second line metallization having a top surface coplanar with the top surface of the first line metallization, the second line metallization having a second height, orthogonal to the top surface, which is greater than the first height.

In second examples, for any of the first examples the via metallization has a via diameter. The first and second line metallizations both have a longitudinal length greater than the via diameter, and a portion of the second line metallization is in contact with the via metallization.

In third examples, for any of the first through second examples the first line metallization is in contact with the trench hardmask material layer, and the first height is no greater than a sum of the third thickness of dielectric material and a thickness of the hardmask material layer. The second height is at least equal to a sum of the second thickness of dielectric material, the third thickness of dielectric material, and the thickness of the hardmask material layer.

In fourth examples, for any of the first through third examples the first line metallization has a first transverse width. A bottom portion of the second line metallization has a second transverse width no larger than a transvers width of an opening through the hardmask material layer. A top portion of the second line metallization has a third transverse width within the first height, the third transverse width being greater than the transverse width of the opening through the hardmask material layer.

In fifth examples, for any of the further examples the IC interconnect structure further comprises a trench stop material layer between the first and second thicknesses of dielectric material. The second height is at least equal to a sum of the second thickness of dielectric material, the third thickness of dielectric material, the thickness of the hardmask material layer, and a thickness of the trench stop material layer.

In sixth examples, for any of the fifth examples the first line metallization is in contact with the hardmask material layer. The first height is greater than a sum of the third thickness of dielectric material and a thickness of the hardmask material layer, but less than a sum of the third thickness of dielectric material, the thickness of the hardmask material layer, and the second thickness of dielectric material.

In seventh examples, for any of the first through sixth examples the second line metallization has the second height along a first longitudinal length, and has the first height over a second longitudinal length.

In eighth examples, for any of the first through seventh examples the first and second line metallizations comprise copper. The first, second, and third thicknesses of dielectric material comprise a low-k dielectric material. The hardmask material layer comprises a dielectric material having a first dielectric constant larger than a second dielectric constant of any of the first, second, and third thicknesses of dielectric material.

In ninth examples, an integrated circuit (IC) structure comprises a device layer comprising a plurality of transistors comprising one or more semiconductor materials. The IC structure comprises plurality of interconnect levels over the device layer. An individual one of the interconnect levels further comprises a via metallization within a first thickness of dielectric material, a second thickness of dielectric material over the first thickness of dielectric material, and a third thickness of dielectric material over the second thickness of dielectric material with a hardmask material layer therebetween. The individual one of the interconnect levels further comprises a first line metallization within the third thickness of dielectric material, the first line metallization having a top surface and a first height, orthogonal to the top surface, that is at least equal to the third thickness of dielectric material. The individual one of the interconnect levels further comprises a second line metallization having a top surface coplanar with the top surface of the first line metallization, the second line metallization having a second height, orthogonal to the top surface, which is greater than the first height.

In tenth examples, a computer platform comprises a power supply, and the IC structure of the ninth example coupled to the power supply.

In eleventh examples, a method of fabricating an interconnect structure comprises receiving a workpiece comprising a via metallization within a first thickness of dielectric material. The method comprises depositing a second thickness of dielectric material over the via metallization and the first thickness of dielectric material. The method comprises depositing a hardmask material layer over the second thickness of dielectric material, and forming an opening through the hardmask material layer. The method comprises depositing a third thickness of dielectric material over the trench and the hardmask material layer, the third thickness of dielectric material filling the opening. The method comprises etching a first trench and a second trench through the third thickness of dielectric material selectively to the hardmask material layer. The first trench intersects the hardmask material layer and the etching stops at a first depth. The second trench intersects the opening and the etching stops at a second depth within the first or second thickness of dielectric material. The method comprises depositing metallization into the first and second trenches. The method comprises planarizing a top surface of the first and second trenches with a top surface of the third thickness of dielectric material.

In twelfth examples, for any of the eleventh examples etching the first trench and the second trench comprises depositing a mask material over the third thickness of dielectric material, patterning a first opening of a first width, the first width completely overlapping the hardmask material and patterning a second opening of a second width, the second width larger than a width of the opening through the hardmask material layer. Etching the first trench and the second trench comprises etching the third thickness of dielectric material in alignment with the first opening to form the first trench, and etching through the third thicknesses of dielectric material in alignment with the second opening, and etching into the second thickness of dielectric material in alignment with the opening in the hardmask material to form the second trench.

In thirteenth examples for any of the twelfth examples etching into the second thickness of dielectric material through the opening in the hardmask material is selective to the hardmask material.

In fourteenth examples, for any of the eleventh through thirteenth examples the method further comprises depositing a trench stop material layer over the via metallization and the first thickness of dielectric material before depositing the second thickness of dielectric material.

In fifteenth examples, for any of the fourteenth examples etching the first trench and the second trench comprises depositing a mask material over the third thickness of dielectric material, patterning a first opening of a first width, the first width completely overlapping the hardmask material, and patterning a second opening of a second width, the second width larger than a width of the opening through the hardmask material layer. Etching the first trench and the second trench further comprises etching the third thickness of dielectric material in alignment with the first opening to form the first trench, and etching through the third thicknesses of dielectric material in alignment with the second opening, and anisotropically etching into the second thickness of dielectric material and the trench stop material layer in alignment with the opening in the hardmask material.

In sixteenth examples, for any of the eleventh through fifteenth examples depositing the hardmask material comprises depositing a dielectric material having a first relative permittivity, and depositing the second thickness of material comprises depositing a dielectric material having a second relative permittivity, lower than the first relative permittivity.

In seventeenth examples, for any of the eleventh through sixteenth examples the first depth is no greater than a sum of the third thickness of dielectric material and a thickness of the trench hardmask material layer, and the second depth is at least equal to a sum of the second thickness of dielectric material, the third thickness of dielectric material, and the thickness of the trench hardmask material layer.

In eighteenth examples, for any of the eleventh through seventeenth examples depositing metallization into the first and second trenches comprises depositing at least copper.

In nineteenth examples, for any of the eighteenth examples depositing metallization into the first and second trenches further comprises depositing the metallization over a portion of the hardmask material at a bottom of the first trench.

In twentieth examples, for any of the eleventh through eighteenth examples forming the opening through the hardmask material layer further comprises etching an unmasked portion of the hardmask material with an anisotropic etch process.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:
1. A integrated circuit (IC) interconnect structure, comprising:
 a via metallization within a first thickness of dielectric material;
 a second thickness of dielectric material over the first thickness of dielectric material;

a third thickness of dielectric material over the second thickness of dielectric material with a hardmask material layer therebetween;

a first line metallization within the third thickness of dielectric material, the first line metallization having a top surface and a first height, orthogonal to the top surface, that is at least equal to the third thickness of dielectric material; and a second line metallization having a top surface coplanar with the top surface of the first line metallization, the second line metallization having a second height, orthogonal to the top surface, which is greater than the first height.

2. The IC interconnect structure of claim 1, wherein:
the via metallization has a via diameter;
the first and second line metallizations both have a longitudinal length greater than the via diameter; and
a portion of the second line metallization is in contact with the via metallization.

3. The IC interconnect structure of claim 1, wherein:
the first line metallization is in contact with the hardmask material layer and the first height is no greater than a sum of the third thickness of dielectric material and a thickness of the hardmask material layer; and
the second height is at least equal to a sum of the second thickness of dielectric material, the third thickness of dielectric material, and the thickness of the hardmask material layer.

4. The IC interconnect structure of claim 1, wherein:
the first line metallization has a first transverse width;
a bottom portion of the second line metallization has a second transverse width no larger than a transvers width of an opening through the hardmask material layer; and
a top portion of the second line metallization has a third transverse width within the first height, the third transverse width being greater than the transverse width of the opening through the hardmask material layer.

5. The IC interconnect structure of claim 4, further comprising a trench stop material layer between the first and second thicknesses of dielectric material, wherein the second height is at least equal to a sum of the second thickness of dielectric material, the third thickness of dielectric material, the thickness of the hardmask material layer, and a thickness of the trench stop material layer.

6. The IC interconnect structure of claim 5, wherein:
the first line metallization is in contact with the hardmask material layer; and
the first height is greater than a sum of the third thickness of dielectric material and a thickness of the hardmask material layer, but less than a sum of the third thickness of dielectric material, the thickness of the hardmask material layer, and the second thickness of dielectric material.

7. The IC interconnect structure of claim 1, wherein the second line metallization has the second height along a first longitudinal length, and has the first height over a second longitudinal length.

8. The IC interconnect structure of claim 1, wherein:
the first and second line metallizations comprise copper;
the first, second, and third thicknesses of dielectric material comprise a low-k dielectric material; and
the hardmask material layer comprises a dielectric material having a first dielectric constant larger than a second dielectric constant of any of the first, second, and third thicknesses of dielectric material.

9. An integrated circuit (IC) structure, comprising:
a device layer comprising a plurality of transistors comprising one or more semiconductor materials; and
a plurality of interconnect levels over the device layer, wherein an individual one of the interconnect levels further comprises:
a via metallization within a first thickness of dielectric material;
a second thickness of dielectric material over the first thickness of dielectric material;
a third thickness of dielectric material over the second thickness of dielectric material with a hardmask material layer therebetween;
a first line metallization within the third thickness of dielectric material, the first line metallization having a top surface and a first height, orthogonal to the top surface, that is at least equal to the third thickness of dielectric material; and
a second line metallization having a top surface coplanar with the top surface of the first line metallization, the second line metallization having a second height, orthogonal to the top surface, which is greater than the first height.

10. A computer platform comprising:
a power supply; and
the IC structure of claim 9 coupled to the power supply.

* * * * *